United States Patent [19]

Dennison et al.

[11] Patent Number: 5,493,130
[45] Date of Patent: Feb. 20, 1996

[54] INTEGRATED CIRCUITRY HAVING AN ELECTRICALLY CONDUCTIVE SIDEWALL LINK POSITIONED OVER AND ELECTRICALLY INTERCONNECTING RESPECTIVE OUTER SIDEWALLS OF TWO CONDUCTIVE LAYERS

[75] Inventors: Charles H. Dennison; Monte Manning, both of Boise, Id.

[73] Assignee: Micron Technology, Inc., Boise, Id.

[21] Appl. No.: 236,486

[22] Filed: Apr. 28, 1994

Related U.S. Application Data

[62] Division of Ser. No. 75,035, Jun. 10, 1993, Pat. No. 5,348,899.

[51] Int. Cl.$^6$ ..................................... H01L 29/76
[52] U.S. Cl. ............... 257/66; 257/67; 257/401; 257/900
[58] Field of Search ............... 257/66, 67, 401, 257/900

[56] References Cited

U.S. PATENT DOCUMENTS

| | | | |
|---|---|---|---|
| 4,966,864 | 10/1990 | Pfiester | 437/52 |
| 4,994,400 | 2/1991 | Yamaguchi et al. | 437/174 |
| 5,015,599 | 5/1991 | Verhaar | 437/41 |
| 5,026,663 | 6/1991 | Zdebel et al. | 437/156 |
| 5,338,959 | 8/1994 | Kim et al. | 257/401 |

FOREIGN PATENT DOCUMENTS

| | | | |
|---|---|---|---|
| 59-112656 | 6/1984 | Japan | 437/157 |
| 60-0083370 | 5/1985 | Japan | 257/66 |
| 62-274662 | 11/1987 | Japan | 257/401 |
| 4254322 | 9/1992 | Japan | 437/20 |

OTHER PUBLICATIONS

Colinge, J. P. et al.; "Silicon–On–Insulator 'Gate–All–Around Device'", IEEE, IEDM 90–595–599 (1990).

Tanaka, T. et al.; "Analysis of P$^{30}$ PolySi Double–Gate Thin–Film SOI MOSFETS", IEEE, IEDM 91–683–686, (1981).

Primary Examiner—Ddonald T. Hajec
Assistant Examiner—Mark Tremblay
Attorney, Agent, or Firm—Wells, St. John, Roberts, Gregory & Matkin

[57] ABSTRACT

The disclosure pertains to a bottom and top gated thin film transistor and other circuitry constructions. In the thin film transistor construction, the top gate electrode (preferably polysilicon) overlaps with the channel region, and the top gate electrode has an electrically conductive sidewall (preferably oxide). The bottom gate electrode (preferably polysilicon) has an outer surface area which includes a portion which extends outwardly beyond the top gate electrode sidewall. An electrically conductive sidewall link overlies the electrically insulated channel region sidewall and extends between the top gate sidewall and bottom gate outer surface portion to electrically interconnect the top and bottom gate electrodes. The insulated channel region sidewall is insulated by an insulating sidewall spacer. The insulating sidewall spacer partially overlaps the top gate electrode electrically conductive sidewall. More generally beyond thin film transistor constructions, two conductive layers are provided which are separated by an insulating material on a semiconductor wafer. Each has an outer sidewall. An electrically conductive sidewall link is positioned over and electrically interconnects the respective outer sidewalls of the two conductive layers. Further, a mid conductive layer is provided which is electrically isolated from and positioned between the inner and outer conductive layers. This layer has a sidewall also covered by an insulating material. The insulating material partially overlaps the outer conductive layer sidewall. The electrically conductive sidewall link is positioned over the insulating material.

4 Claims, 14 Drawing Sheets

_Fig. 22_

_Fig. 23_

Fig. 24

Fig. 25

INTEGRATED CIRCUITRY HAVING AN ELECTRICALLY CONDUCTIVE SIDEWALL LINK POSITIONED OVER AND ELECTRICALLY INTERCONNECTING RESPECTIVE OUTER SIDEWALLS OF TWO CONDUCTIVE LAYERS

This invention was made with Government support under Contract No. MDA972-92-C-0054 awarded by Advanced Research Projects Agency (ARPA). The Government has certain rights in this invention.

RELATED PATENT DATA

This patent resulted from a divisional application of U.S. application Ser. No. 08/075,035, filed Jun. 10, 1993, which issued as U.S. Pat. No. 5,348,899 on Sep. 20, 1994.

TECHNICAL FIELD

This invention relates to electrical interconnection and thin film transistor fabrication methods, and to integrated circuitry having electrically interconnected layers.

BACKGROUND OF THE INVENTION

The invention grew out of needs associated with thin film transistors (TFTs) and their usage in high-density static random access memories (SRAMs). A static memory cell is characterized by operation in one of two mutually exclusive and cell-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" memory cell operating state. A low or reset output voltage usually represents a binary value of zero, and a high or set output voltage represents a binary value of one.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells, such as dynamic cells, which do not have stable operating states. A dynamic memory cell can be programmed to store a voltage which represents one of two binary values, but requires periodic reprogramming or "refreshing" to maintain this voltage for more than very short time periods. A dynamic memory cell has no feedback to maintain a stable output voltage. Without refreshing, the output of a dynamic memory cell will drift toward intermediate or indeterminate voltages, effectively resulting in loss of data.

Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along a different path than has the design of dynamic memories.

Ongoing efforts in SRAM circuitry to improve active loads has brought about the development of TFTs in attempts to provide low leakage current as well as high noise immunity. While the invention grew out of needs associated with TFTs of SRAM circuitry, the artisan will appreciate applicability of the invention to other types of circuitry.

Figure 1:
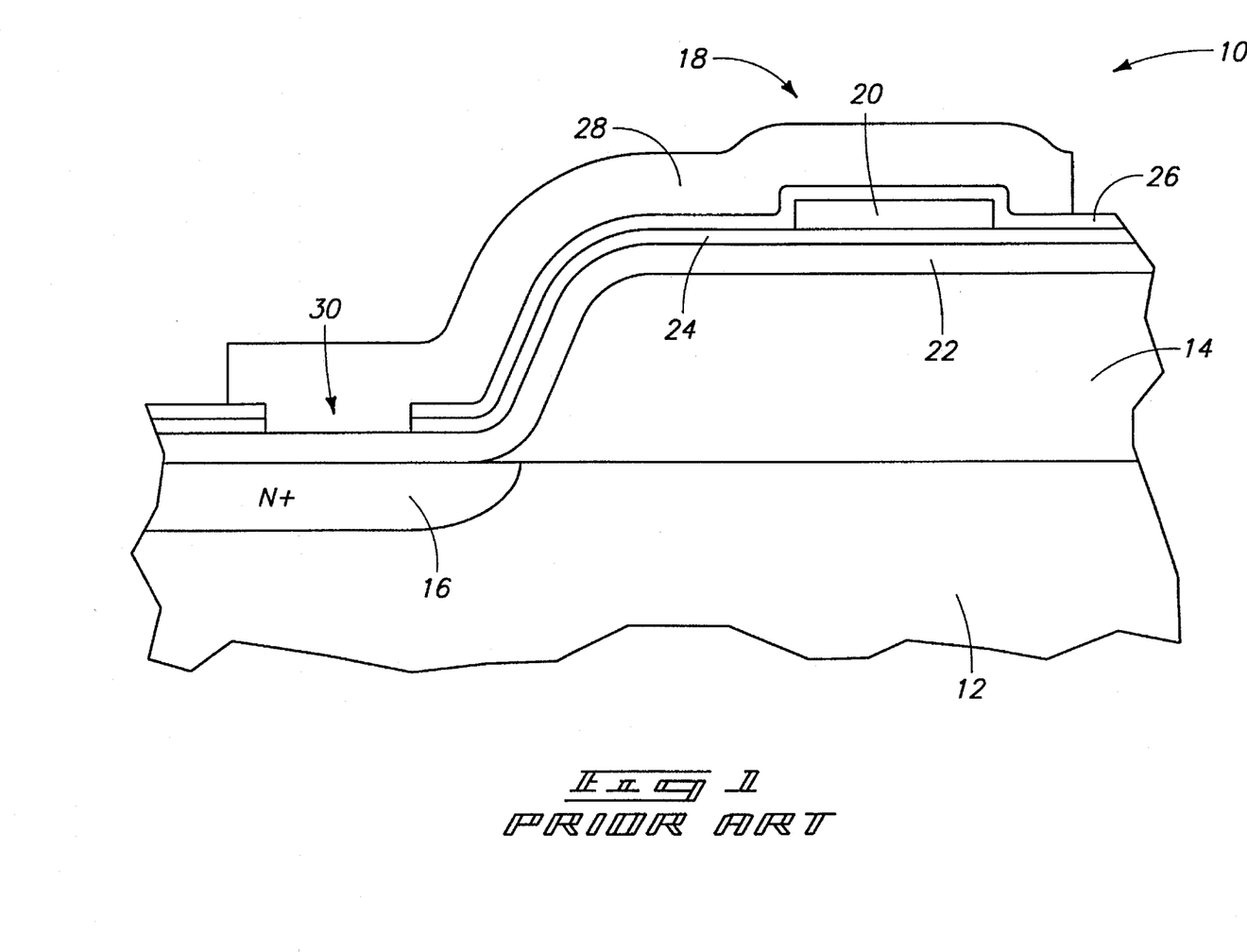
FIG. 1 is a diagrammatic section of a semiconductor wafer fragment processed in accordance with prior art methods, and is described in the "Background" section above.

Some recent TFT technology employs fully surrounded field effect transistor (FET) gate regions, such as shown in FIG. 1. Such illustrates a semiconductor wafer fragment 10 comprised of a bulk substrate 12 and overlying insulating layer 14. Bulk substrate 12 includes an n+ active area 16 which electrically connects with a gate of a thin film transistor, which is generally indicated by numeral 18. Such transistor includes a channel region 20. The adjacent source and drain of such transistor would be into and out of the plane of the paper on which FIG. 1 appears. A first or bottom gate conductive layer 22 is provided over insulating layer 14 and extends to electrically connect with active area 16. A bottom gate oxide dielectric layer 24 is provided atop bottom gate layer 22 and contacts with the bottom of transistor channel region 20. A top gate layer 26 overlies bottom dielectric layer 24 and the top of transistor channel region 20. An electrically conductive top gate layer 28 is provided and patterned over top gate oxide dielectric layer 26. A contact opening 30 is provided through top and bottom gate oxide layers 26, 24 respectively, over active area 16 prior to top gate layer 28 deposition. Such results in electrical interconnection of top gate 28 with a bottom gate 22. Thus, channel region 20 is surrounded by conductive gate material for switching transistor 18 "on".

The above described construction requires photolithography and etch steps for producing contact opening 30, and separate patterning of top gate electrode 28. It would be desirable to provide methods of forming thin film transistors which minimize photolithography and etching steps.

SUMMARY OF THE INVENTION

In accordance with one aspect of the invention, an integrated circuit comprises:

two conductive layers separated by an insulating material on a semiconductor wafer, the conductive layers each having an outer sidewall; and an electrically conductive sidewall link positioned over and electrically interconnecting the respective outer sidewalls of the two conductive layers.

In accordance with another aspect of the invention, an integrated circuit comprises:

inner and outer conductive layers separated by an insulating material on a semiconductor wafer, the outer conductive layer having a sidewall, the inner conductive layer having an outer conductive surface; and an electrically conductive sidewall link positioned over and electrically interconnecting the outer conductive layer sidewall and inner conductive layer outer conductive surface.

In accordance with still a further aspect of the invention, a bottom and top gated thin film transistor comprises:

a conductive bottom thin film transistor gate electrode, the bottom gate electrode having a planarized outer surface, the outer surface having a surface area;

a bottom gate dielectric layer atop the bottom gate electrode;

a thin film transistor body layer over the bottom gate layer, the thin film transistor body layer having source, drain and channel regions, the channel region overlapping with the bottom gate electrode, the channel region having an insulated sidewall;

a top gate dielectric layer over the thin film transistor body layer;

an electrically conductive top thin film transistor gate electrode over the top gate dielectric layer, the top gate electrode overlapping with the channel region, the top gate electrode having an electrically conductive sidewall, the bottom gate electrode outer surface area including a portion extending outwardly beyond the top gate electrode sidewall; and an electrically conductive sidewall link overlying the electrically insulated channel region sidewall and extending between the top gate sidewall and bottom gate outer surface portion to electrically interconnect the top and bottom gate electrodes.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In the context of this document, "electrically conductive material" signifies a material which is inherently conductive as deposited, or capable of being rendered electrically conducted by subsequent processing steps or applications of conventional operational electric fields.

Figure 2:
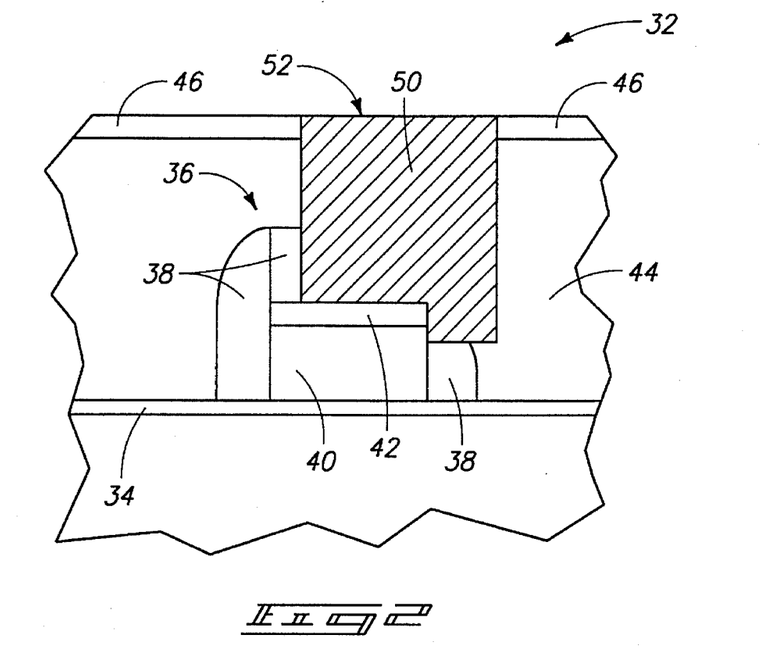
FIG. 2 is a diagrammatic section of a semiconductor wafer fragment processed in accordance with the invention. Such view is a section of the wafer fragment taken along a position relative to line 2—2 in FIG. 4.
Figure 3:
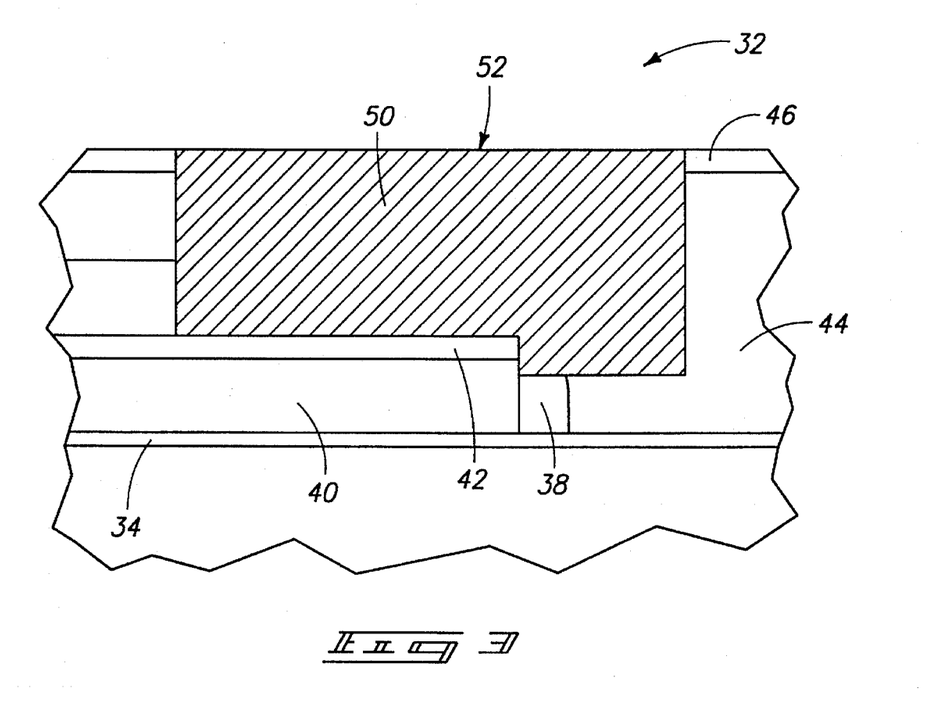
FIG. 3 is a view of the FIG. 2 wafer fragment taken at a same processing step as that illustrated by FIG. 2. Such view is a section of the wafer fragment taken along a position relative to line 3—3 in FIG. 4.
Figure 4:
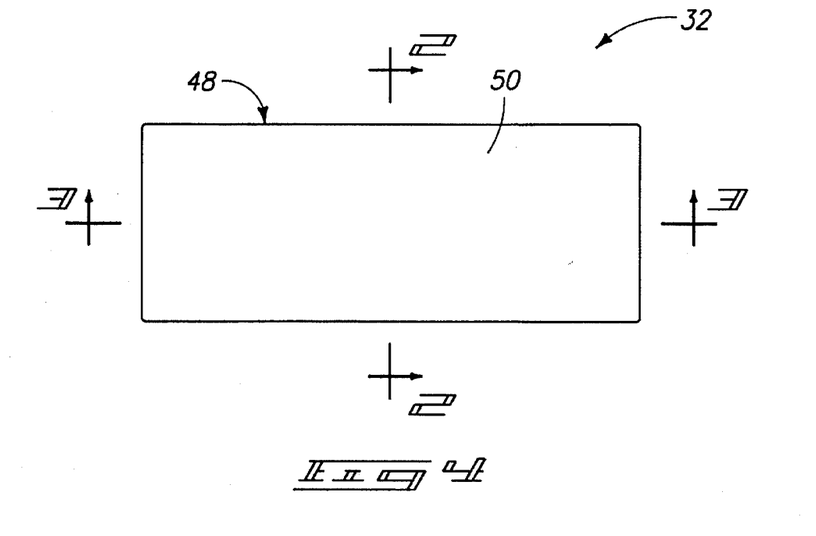
FIG. 4 is a diagrammatic top plan view of the FIG. 2 wafer fragment taken at the same processing step as that illustrated by FIG. 2.

More specifically and referring initially to FIGS. 2–4, a semiconductor wafer fragment is indicated generally by reference numeral 32. Such comprises a gate oxide layer 34 and word line 36. Bulk substrate would exist below gate oxide 34, and is not shown for clarity. Word line 36 is comprised of insulating regions 38, electrically conductive polysilicon region 40, and overlying electrically conductive silicide region 42. An insulating oxide layer 44 and subsequent insulative nitride layer 46 are provided over word line 36. Layers 46 and 44 have been photo-patterned and etched to produce a bottom electrode contact outline 48 (FIG. 4) which extends inwardly to expose and ultimately provide electrical connection silicide region 42 of word line 36. The etch is timed such that silicide region 42 is reached with minimal over-etch such that the adjacent substrate is not reached. Subsequently, a layer of electrically conductive material, preferably polysilicon, is deposited atop the wafer to a thickness sufficient to completely fill bottom thin film transistor gate electrode outline 48. Such layer is then chemical-mechanical polished (CMP) to isolate and define an electrically conductive bottom thin film transistor gate electrode 50 on a semiconductor substrate. Such electrode has a planarized outer surface 52 and an outer surface area defined by outline 48. A more detailed description of forming such a construction if is described in our co-pending U.S. patent application Ser. No. 08/061,402, filed on May 12, 1993, and entitled "Fully Planarized Thin Film Transistor (TFT) and Process To Fabricate Same", which is hereby incorporated by reference.

Figure 5:
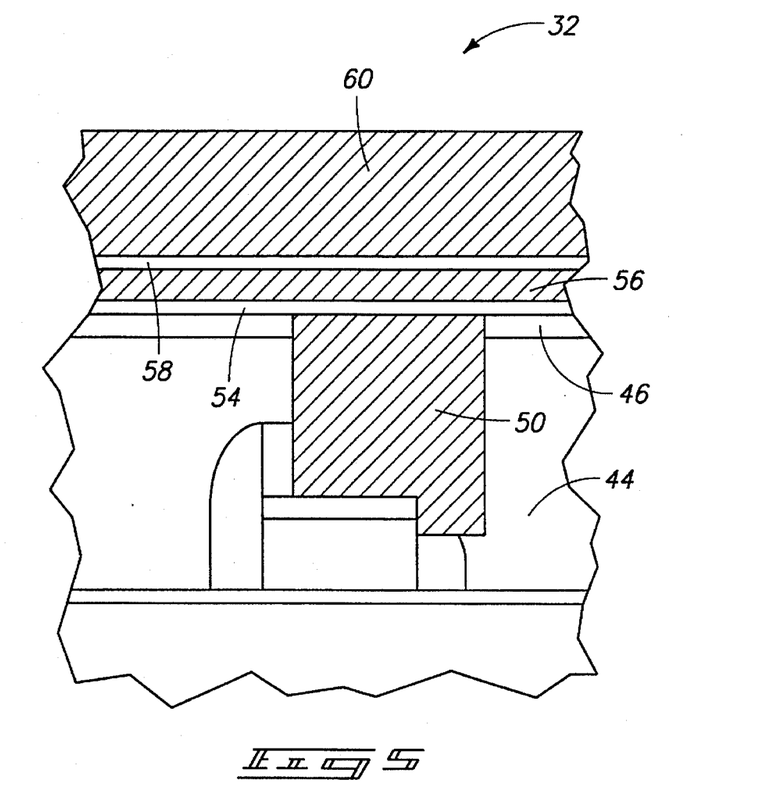
FIG. 5 is a view of the FIG. 2 wafer fragment taken at the same relative position as FIG. 2, but at a process step subsequent to that illustrated by FIG. 2.
Figure 6:
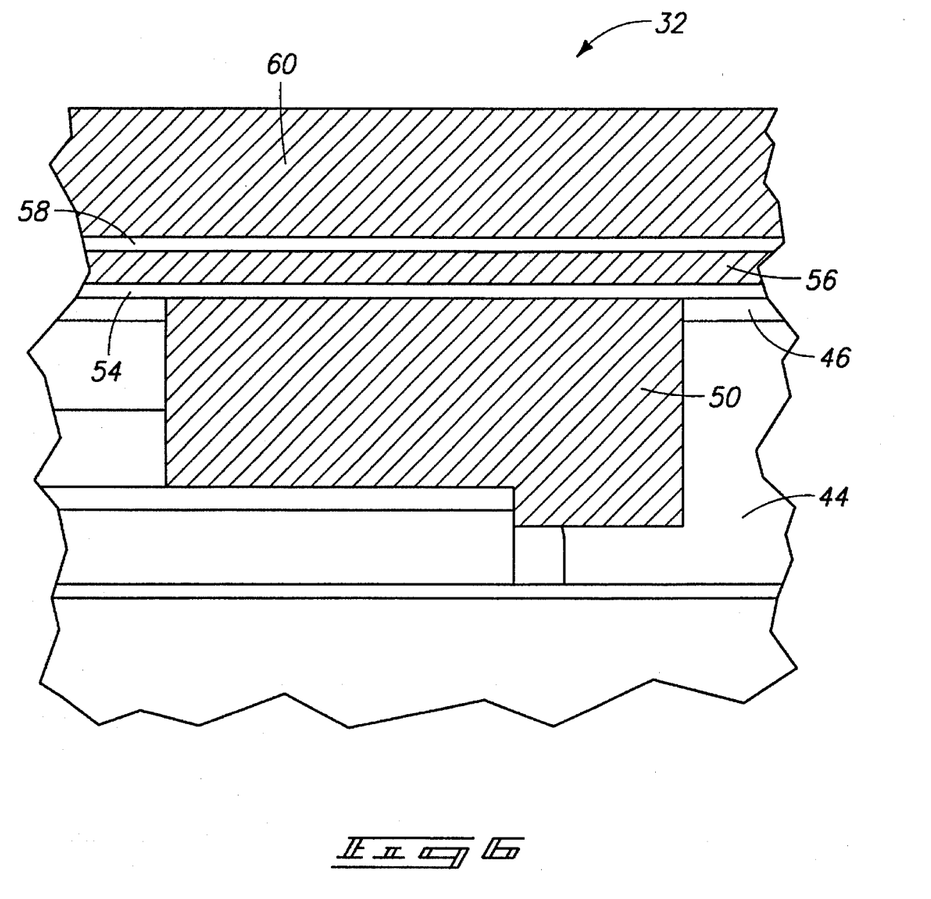
FIG. 6 is a view of the FIG. 2 wafer fragment taken at the same relative position as FIG. 3, but at a process step subsequent to that illustrated by FIG. 3 and corresponding in process sequence to that of FIG. 5.

Referring to FIGS. 5 and 6, a bottom gate dielectric layer 54 is provided over bottom gate electrode layer 50. Such preferably comprises $SiO_2$ deposited to a thickness of from about 100 Angstroms to about 500 Angstroms. A thin film transistor body layer 56 is provided over bottom gate layer 54. Such is preferably amorphous silicon as-deposited, which is then transformed to polycrystalline silicon by solid phase crystallization technique. Such preferably is provided to a thickness of from about 100 Angstroms to about 700 Angstroms. A conventional $V_t$ n− adjust implant into layer 56 would then preferably be provided. A top gate dielectric layer 58 is provided over thin film transistor body layer 56. Such preferably comprises $SiO_2$ deposited to a thickness of from about 100 Angstroms to about 500 Angstroms. An electrically conductive top transistor gate electrode layer 60 is provided over top gate dielectric layer 58. Such preferably comprises in situ conductively doped polysilicon deposited to a thickness of about 2,000 Angstroms. Thus, and for purposes of the continuing discussion, inner and outer conductive layers 50 and 60 respectively, are provided on a semiconductor wafer. Such are separated by an insulating material in the form of dielectric layers 54 and 58, and the insulative nature of semiconductor material 56.

Figure 7:
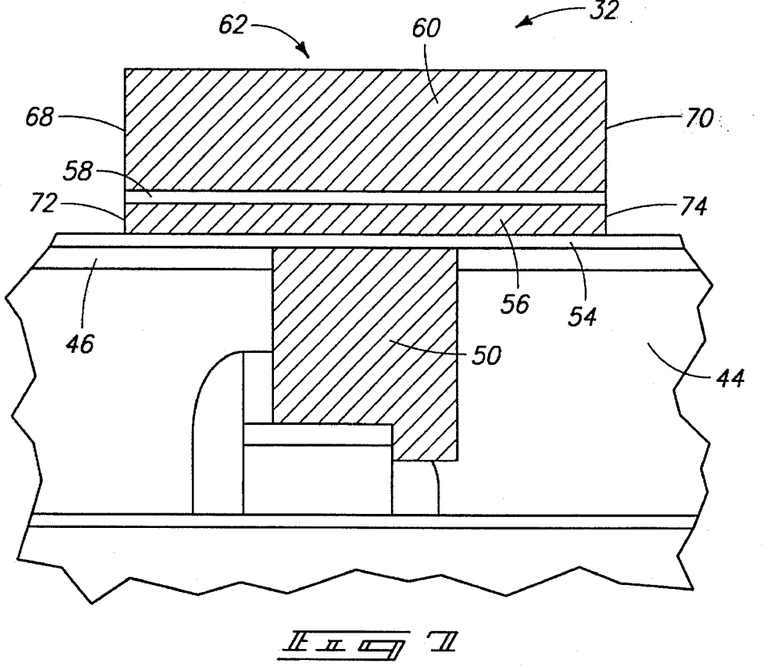
FIG. 7 is a view of the FIG. 2 wafer fragment taken at the same relative position as FIG. 2, but at a process step subsequent to that illustrated by FIG. 5.
Figure 8:
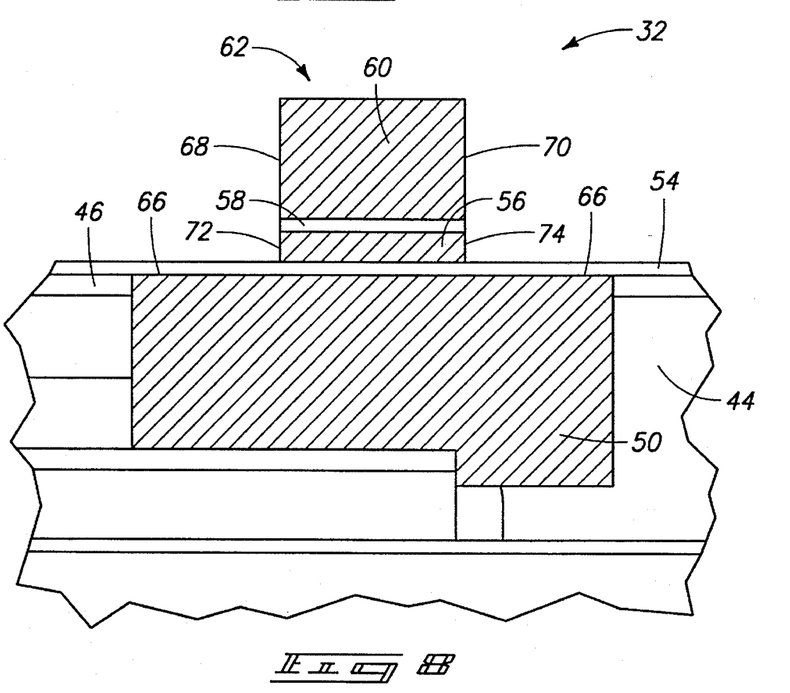
FIG. 8 is a view of the FIG. 2 wafer fragment taken at the same relative position as FIG. 3, but at a process step subsequent to that illustrated by FIG. 6 and corresponding in process sequence to that of FIG. 7.
Figure 9:
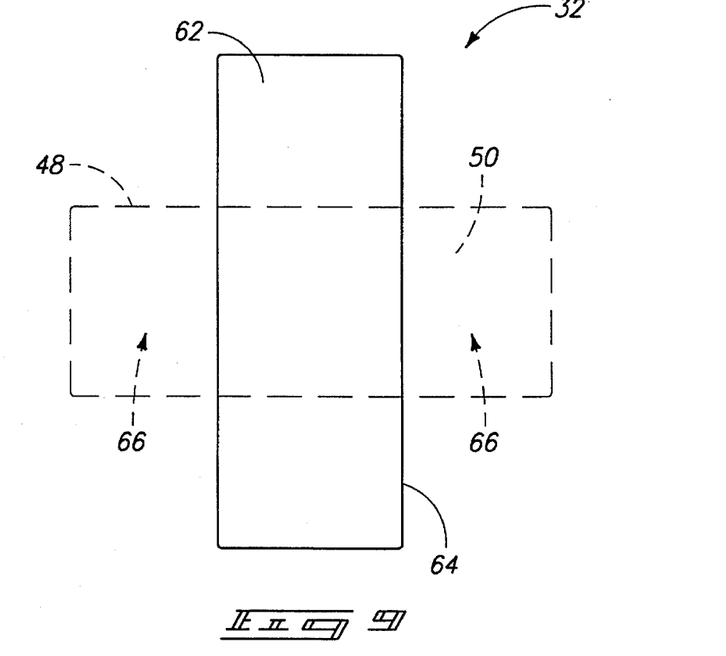
FIG. 9 is a top plan view of the FIG. 2 wafer fragment taken at the same processing step as that illustrated by FIG. 7.

Referring to FIGS. 7–9, composite top gate electrode, top gate dielectric, and body layers 60, 58, and 56 respectively, are etched in a pattern which defines an electrically conductive top gate electrode 62, top gate dielectric and body outline 64 which is received only partially within bottom gate electrode outer surface area 48. Preferably and as shown, such composite etching is preferably conducted to be selective to bottom gate dielectric layer 54. Bottom gate electrode outer surface area 48 (FIG. 9) includes portions 66 which extend outwardly beyond outline 64. For purposes of the continuing discussion, such composite etching defines an opposing pair of outwardly exposed top gate electrode sidewalls 68, 70, and an opposing pair of body sidewalls 72 and 74.

Figure 10:
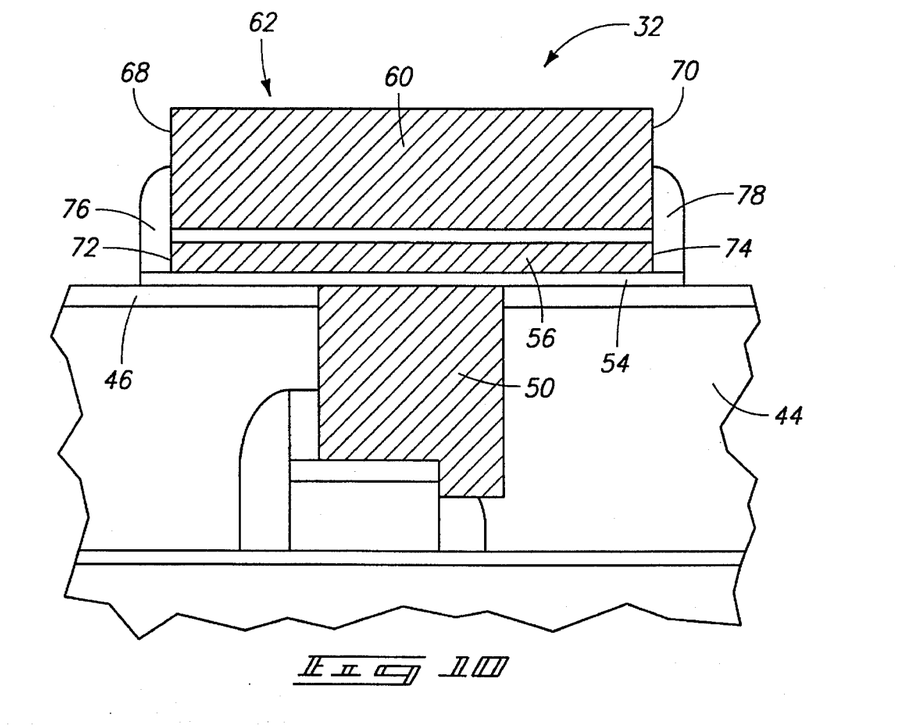
FIG. 10 is a view of the FIG. 2 wafer fragment taken at the same relative position as FIG. 2, but at a process step subsequent to that illustrated by FIG. 7.
Figure 11:
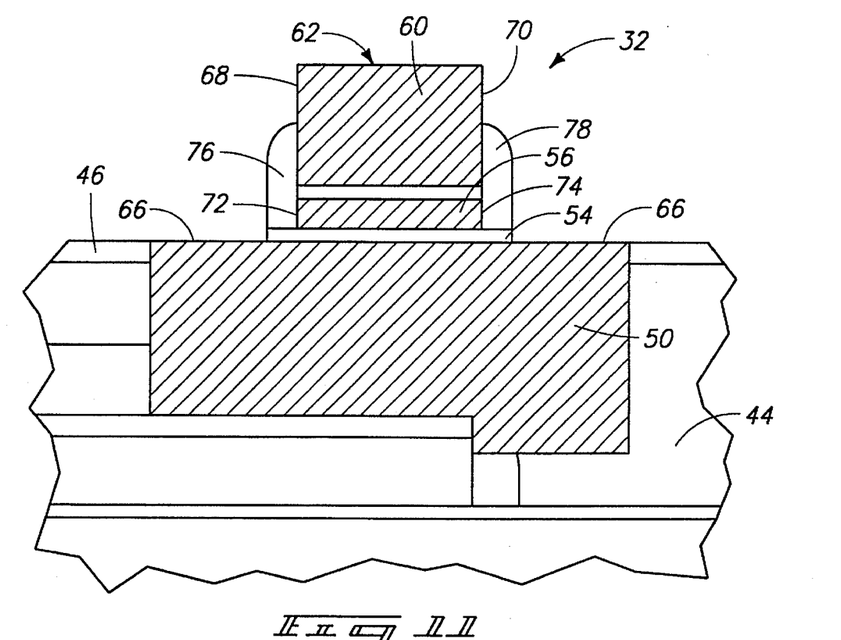
FIG. 11 is a view of the FIG. 2 wafer fragment taken at the same relative position as FIG. 3, but at a process step subsequent to that illustrated by FIG. 8 and corresponding in process sequence to that of FIG. 10.
Figure 12:
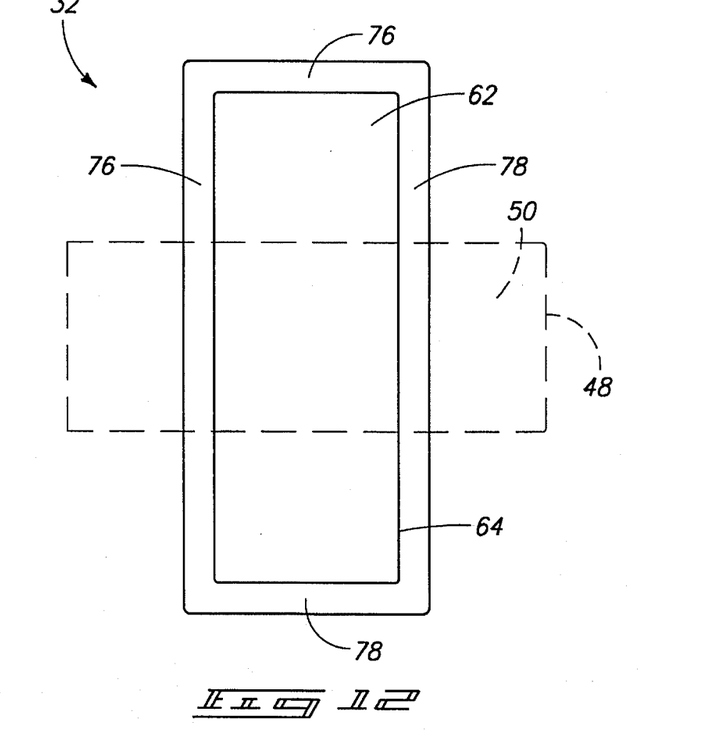
FIG. 12 is a top plan view of the FIG. 2 wafer fragment taken at the same processing step as that illustrated by FIG. 10.

Referring to FIGS. 10–12, a layer of insulating dielectric, such as $SiO_2$, is provided over etched top gate electrode 62 and outwardly exposed sidewalls 68, 70, 72 and 74. Such layer is anisotropically etched to define insulating sidewall spacers 76 and 78 which leaves top gate electrode 62 outer sidewalls 68 and 70 outwardly exposed. Most preferably, such anisotropic etching is conducted without any photomasking relative to spacers 76 and 78 formation, to outwardly expose approximately 800 Angstroms of sidewalls 76 and 78 elevation. Photomasking might occur elsewhere with respect to the wafer, but preferably not for the purposes of forming such sidewall spacers. Most preferably, no photomasking occurs during this etching step. As shown, such insulating layer is preferably etched to form spacers 76 and 78 which partially overlap outwardly exposed top gate electrode sidewalls 68 and 70, yet provide outwardly exposed portions as well. Such etching is also conducted to etch bottom gate dielectric layer 54 to outwardly expose bottom gate electrode upper surface area portions 66 which extend outwardly beyond outline 64. Thus, bottom gate electrode surface area 66 extending outwardly beyond outline 64 is outwardly exposed. Further, inner and outer conductive layers 50 and 52 are thus etched to outwardly expose a sidewall of outer conductive layer 60, and to outwardly expose inner conductive layer 50. Alternately considered, thin film transistor body layer 56 can be considered as a mid-conductive layer, or more accurately a conductive capable layer, which is electrically isolated from and positioned between inner and outer conductive layers 60 and 50, respectively. Mid-conductive layer 56 thus includes sidewalls 72 and 74 which are covered by an insulating material in the form of spacers 76 and 78. The preferred thickness of the layer from which spacers 76 and 78 are formed is about 150 to 400 Angstroms, leaving the width of spacers 76 and 78 at preferably about 100 to 350 Angstroms.

Figure 13:
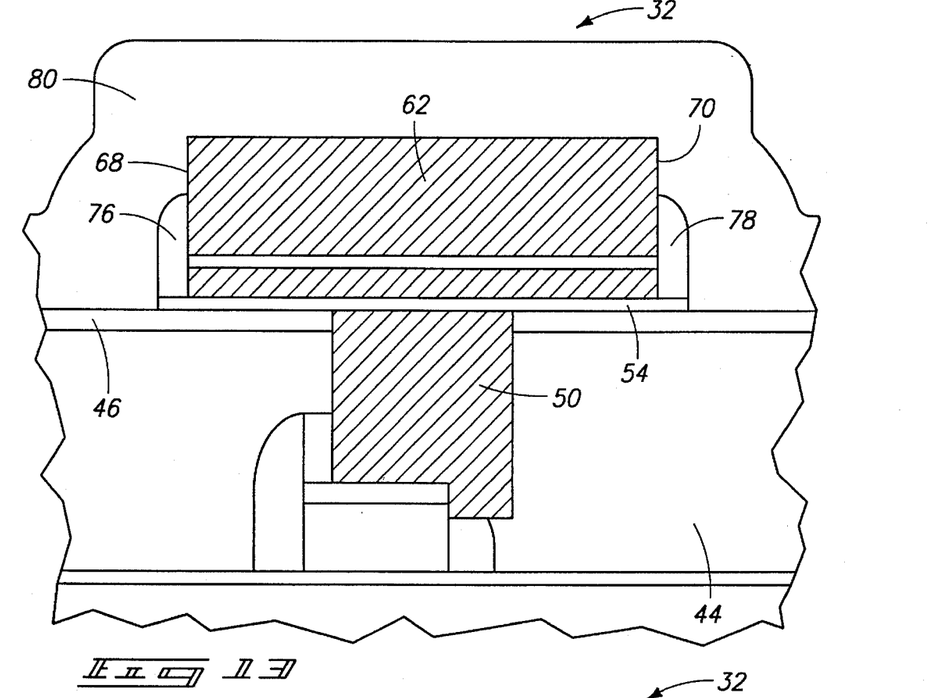
FIG. 13 is a view of the FIG. 2 wafer fragment taken at the same relative position as FIG. 2, but at a process step subsequent to that illustrated by FIG. 10.
Figure 14:
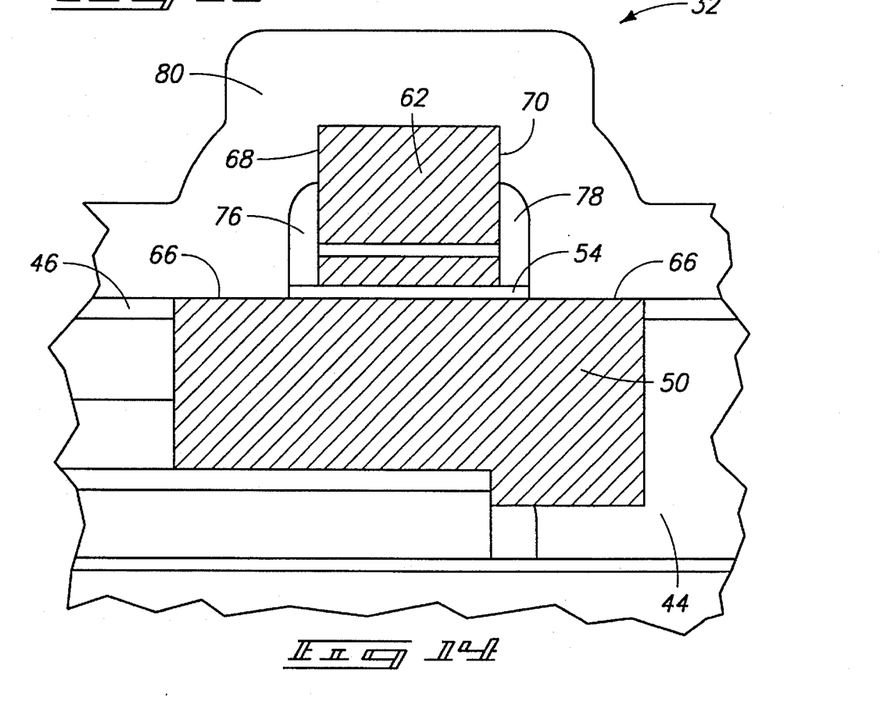
FIG. 14 is a view of the FIG. 2 wafer fragment taken at the same relative position as FIG. 3, but at a process step subsequent to that illustrated by FIG. 10 and corresponding in process sequence to that of FIG. 13.

Referring to FIGS. 13 and 14, a layer 80 of electrically conductive material is provided over the outwardly exposed top gate electrode 62, sidewalls 68 and 70, and over insulating spacers 76 and 78, and over outwardly exposed bottom gate electrode surface area portions 66. Layer 80 preferably comprises in situ conductively doped polysilicon provided to a thickness of about 1,000 Angstroms. As will be appreciated by the artisan, electrical interconnection has thus been made between top gate electrode 62 and bottom gate electrode 50 without the typical added associated photo lithography step for connecting such electrodes as is shown by FIG. 1.

Figure 15:
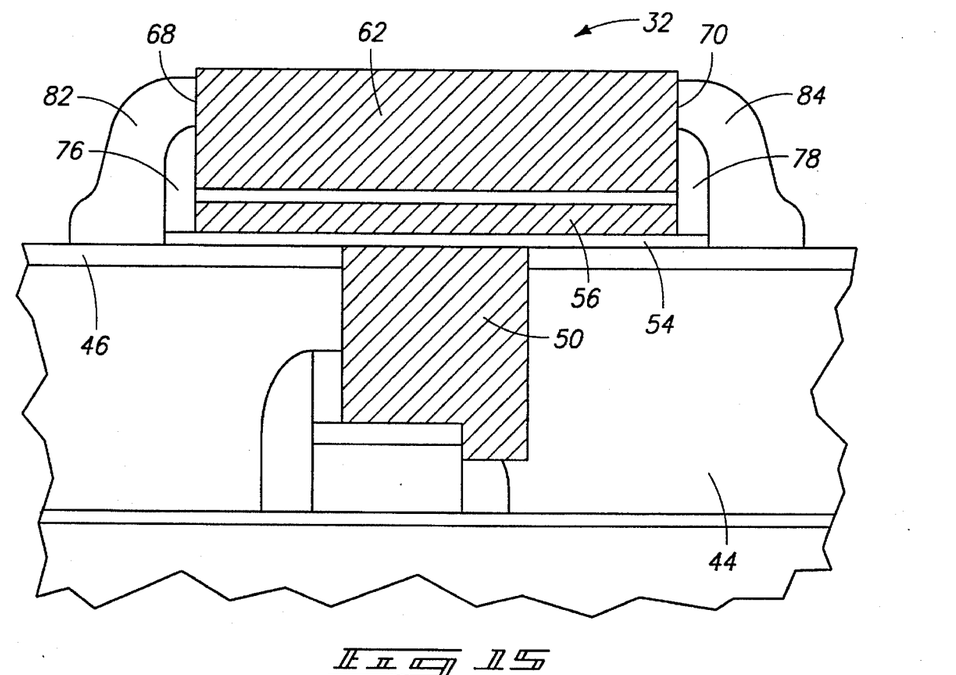
FIG. 15 is a view of the FIG. 2 wafer fragment taken at the same relative position as FIG. 2, but at a process step subsequent to that illustrated by FIG. 13.
Figure 16:
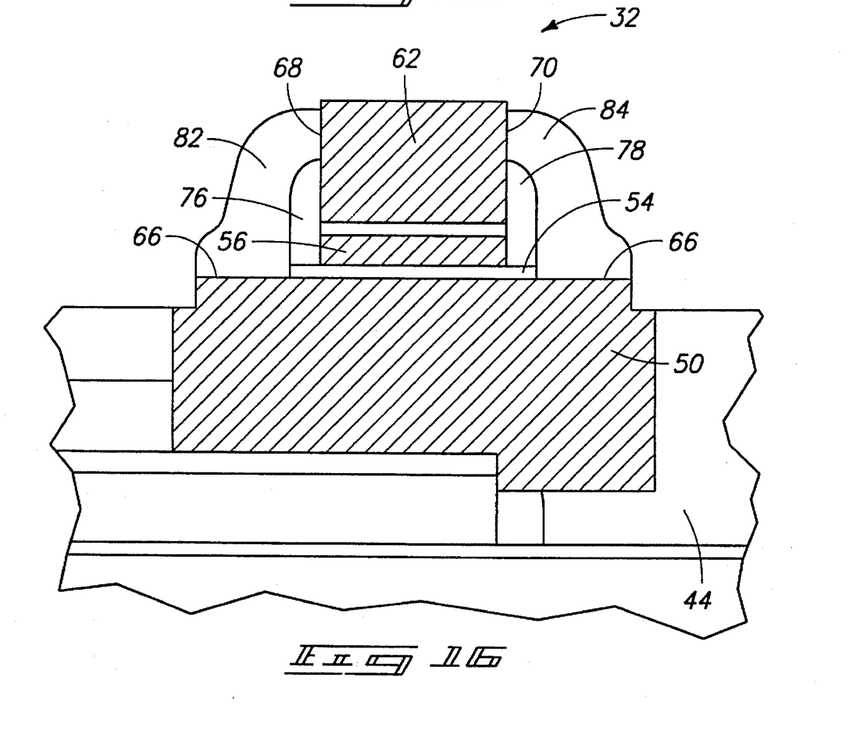
FIG. 16 is a view of the FIG. 2 wafer fragment taken at the same relative position as FIG. 3, but at a process step subsequent to that illustrated by FIG. 14 and corresponding in process sequence to that of FIG. 15.
Figure 17:
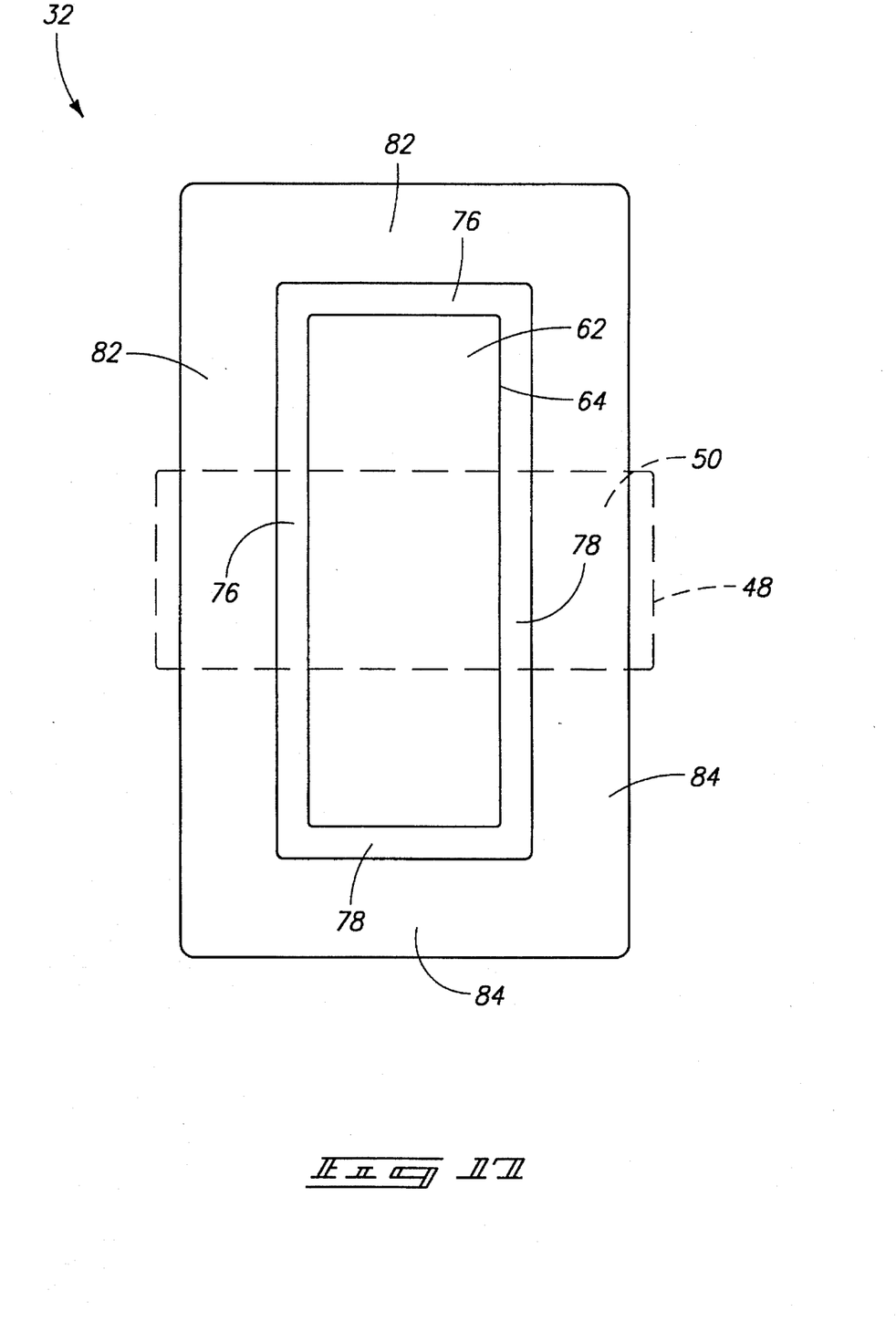
FIG. 17 is a top plan view of the FIG. 2 wafer fragment taken at the same processing step as that illustrated by FIG. 15.

Referring to FIGS. 15–17, layer 80 is anisotropically etched to define electrically conductive sidewall links 82 and 84 which electrically interconnect top gate electrode sidewalls 68, 70, and bottom gate electrode surface area portions 66. Such anisotropic etching is again preferably conducted without any photomasking relative to the sidewall link formation, while photomasking might occur elsewhere on the wafer. Most preferably, no photomasking occurs during this etching step.

Figure 18:
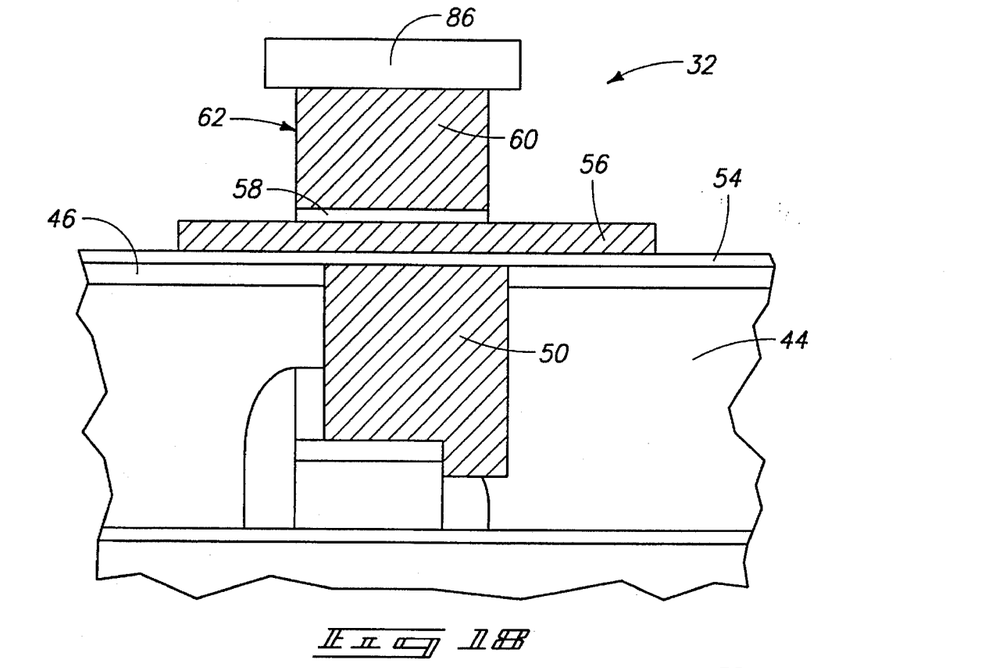
FIG. 18 is a view of the FIG. 2 wafer fragment taken at the same relative position as FIG. 2, but at a process step subsequent to that illustrated by FIG. 15.
Figure 19:
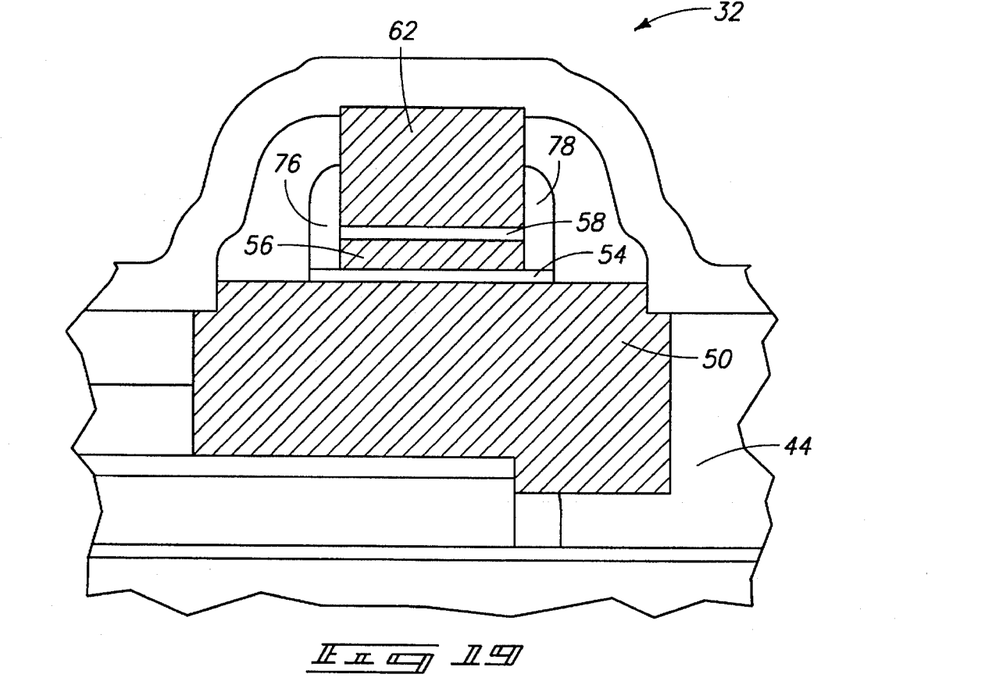
FIG. 19 is a view of the FIG. 2 wafer fragment taken at the same relative position as FIG. 3, but at a process step subsequent to that illustrated by FIG. 16 and corresponding in process sequence to that of FIG. 18.
Figure 20:
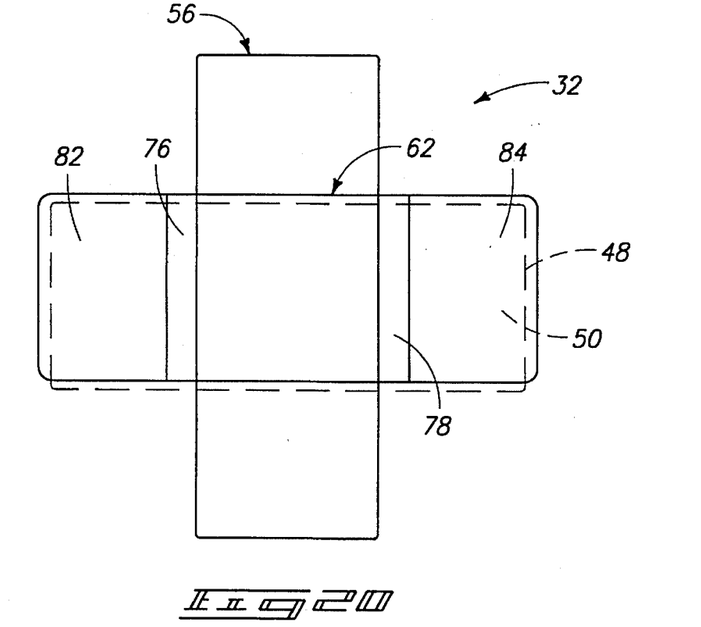
FIG. 20 is a top plan view of the FIG. 2 wafer fragment taken at the same processing step as that illustrated by FIG. 18.

Referring to FIGS. 18–20, a layer of photoresist 86 is deposited and patterned, and top electrode layer 60 subsequently etched to provide the illustrated offset of top gate electrode 62 relative to bottom gate electrode 50. Preferably, the etch of polysilicon 60 is terminated in an isotropic undercut etch to optionally enable a p− LDD implant into a region between p+ source/drain regions and transistor body region 56.

Figure 21:
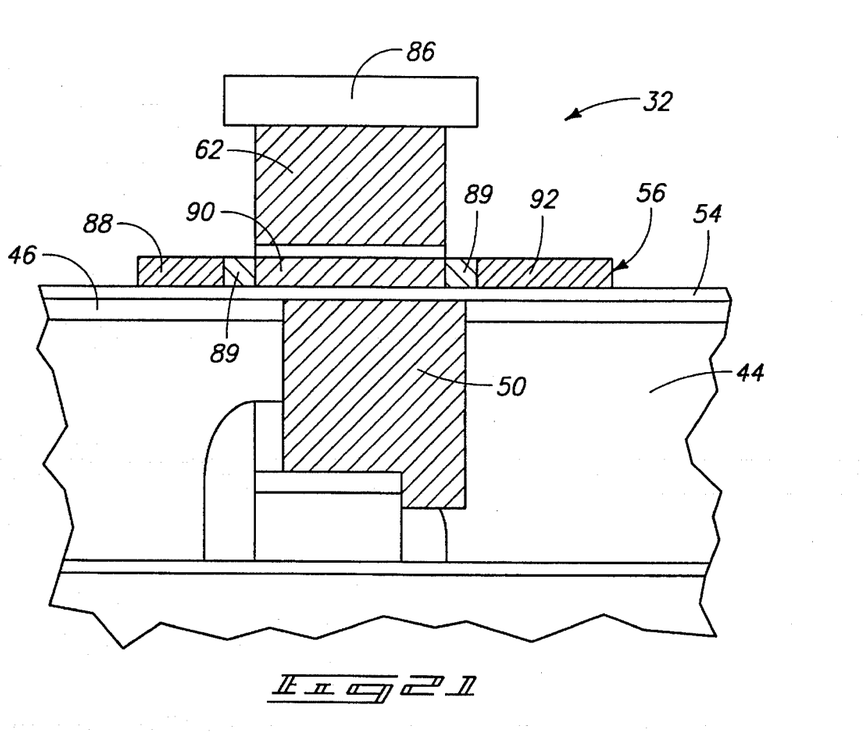
FIG. 21 is a view of the FIG. 2 wafer fragment taken at the same relative position as FIG. 2, but at a process step subsequent to that illustrated by FIG. 18.
Figure 22:
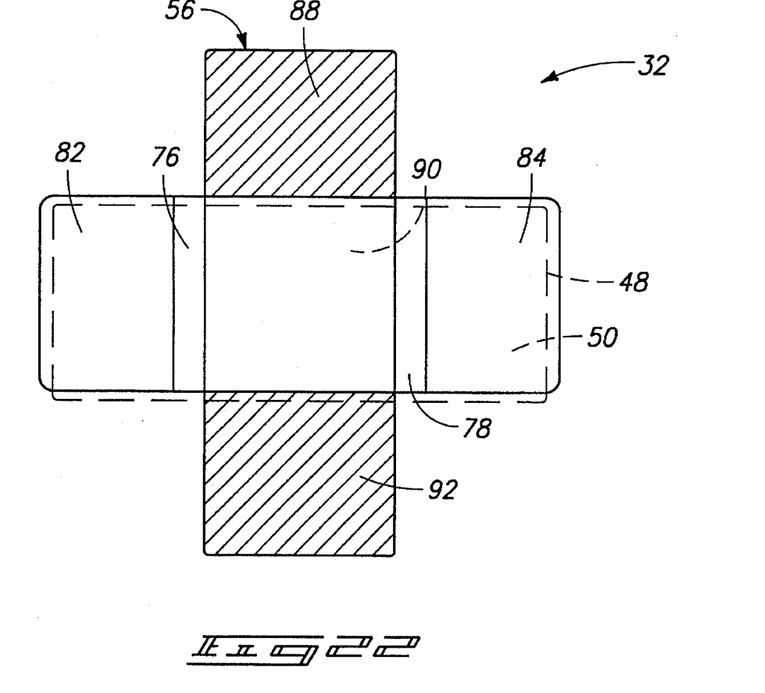
FIG. 22 is a top plan view of the FIG. 2 wafer fragment taken at the same processing step as that illustrated by FIG. 21.

Referring to FIGS. 21 and 22, the masked wafer is subjected to a p+ implant (with resist layer 86 still in place) for definition of source and drain regions 92, 88 respectively. Such also effectively defines a channel region 90 within thin film transistor body layer 56. Channel region overlaps with the bottom gate electrode, and has an insulated sidewall (FIG. 19). Thus in accordance with the above described method, source/drain and channel regions are effectively defined by anisotropic etching of the layer of conductive material utilized to form sidewall interconnecting links 82 and 84. Preferably, top gate electrode 62 underlaps bottom gate electrode 50 on the source and overlaps bottom gate electrode 50 on the drain side, as is shown. If desired, the illustrated resist overhang can be utilized for providing a blanket p– implant 89 after the p+ implant is done with resist still in place, and then the resist is stripped off (to provide a PMOS LDD structure).

Figure 23:
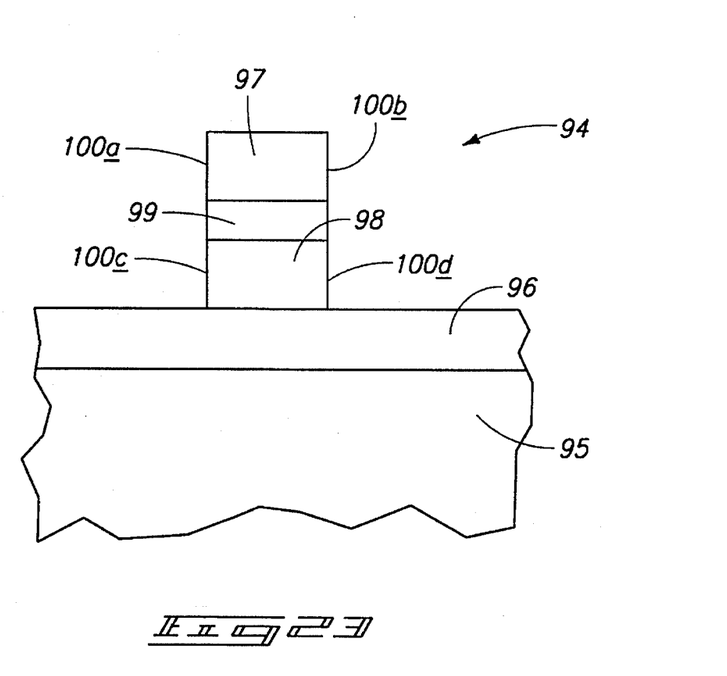
FIG. 23 is a diagrammatic section of an alternate wafer fragment at a processing step in accordance with another aspect of the invention.

Further aspects of the invention are described with reference to FIGS. 23–25. Such illustrates a semiconductor wafer fragment 94 comprised of a bulk substrate 95 and overlying insulating region 96. Two conductive layers 97 and 98, separated by an insulating material layer 99, are provided atop insulating layer 96. Such conductive and insulating materials are etched, as shown, to define an opposing pair of outwardly exposed sidewalls 100a, 100b, and 100c, 100d, for each conductive layer.

Figure 24:
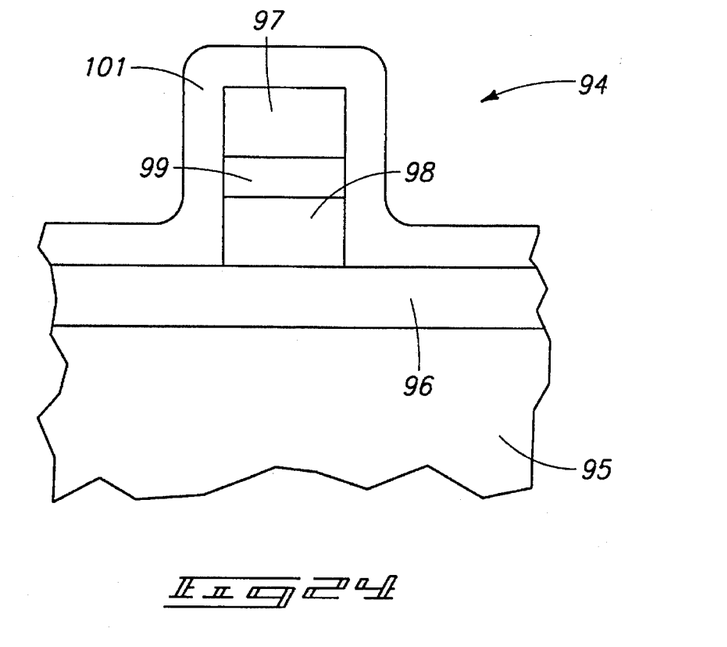
FIG. 24 is a view of the FIG. 23 wafer fragment taken at a processing step subsequent to that illustrated by FIG. 23.

Referring to FIG. 24, a layer 101 of an electrically conductive material is deposited over etched conductive layers 97 and 98 and their respective sidewalls 100a, 100b and 100c, 100d. The preferred material for conductive layer 101 is in situ conductively doped polysilicon.

Figure 25:
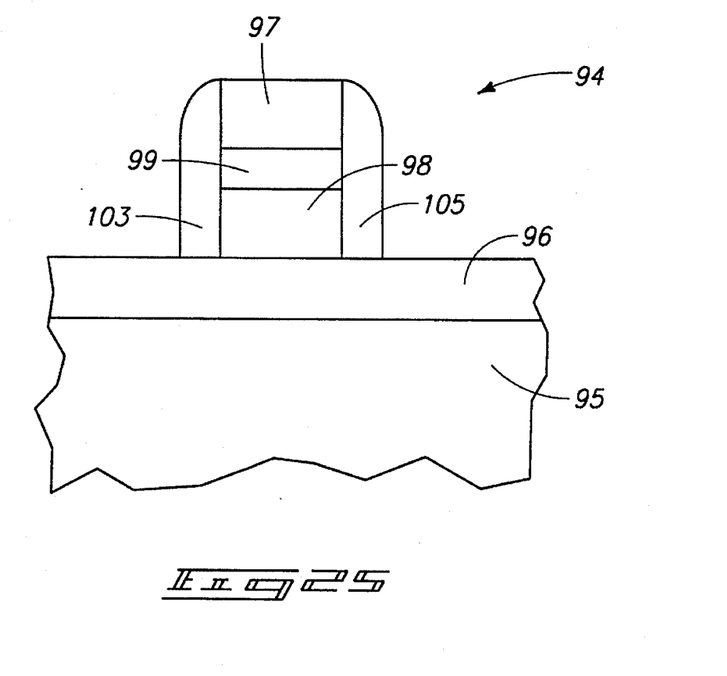
FIG. 25 is a view of the FIG. 23 wafer fragment taken at a processing step subsequent to that illustrated by FIG. 24.

Referring to FIG. 25, layer 101 is subjected to an anisotropic etch to define a pair of electrically conductive sidewall links 103 and 105 which effectively electrically interconnect conductive layers 97 and 98. Such anisotropic etching is most preferably conducting without photomasking relative to the sidewall link formation, while other areas of the wafer might be masked. Most preferably, no photomasking occurs during this etching step.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A bottom and top gated thin film transistor comprising:

a conductive bottom thin film transistor gate electrode, the bottom gate electrode having a planarized outer surface, the outer surface having a surface area;

a bottom gate dielectric layer atop the bottom gate electrode;

a thin film transistor body layer over the bottom gate layer, the thin film transistor body layer having source, drain and channel regions, the channel region overlapping with the bottom gate electrode, the channel region having an insulated sidewall;

a top gate dielectric layer over the thin film transistor body layer;

an electrically conductive top thin film transistor gate electrode over the top gate dielectric layer, the top gate electrode overlapping with the channel region, the top gate electrode having an electrically conductive sidewall, the bottom gate electrode outer surface area including a portion extending outwardly beyond the top gate electrode sidewall; and an electrically conductive sidewall link overlying the electrically insulated channel region sidewall and extending between the top gate sidewall and bottom gate outer surface portion to electrically interconnect the top and bottom gate electrodes;

wherein the insulated channel region sidewall is insulated by an insulating sidewall spacer, the insulating sidewall spacer partially overlapping the top gate electrode electrically conductive sidewall.

2. The bottom and top gated thin film transistor of claim 1 wherein the electrically conductive sidewall link comprises polysilicon.

3. An integrated circuit comprising:

inner and outer conductive layers separated by an insulating material on a semiconductor wafer, the outer conductive layer having a sidewall, the inner conductive layer having an outer conductive surface;

an electrically conductive sidewall link positioned over and electrically interconnecting the outer conductive layer sidewall and inner conductive layer outer conductive surface; and a mid conductive layer electrically isolated from and positioned between the inner and outer conductive layers, the mid conductive layer having a sidewall covered by an insulating material, the insulating material partially overlapping the outer conductive layer sidewall, the electrically conductive sidewall link being positioned over the insulating material.

4. An integrated circuit comprising:

inner and outer conductive layers separated by an insulating material on a semiconductor wafer, the outer conductive layer having a sidewall, the inner conductive layer having an outer conductive surface;

an electrically conductive sidewall link positioned over and electrically interconnecting the outer conductive layer sidewall and inner conductive layer outer conductive surface; and a mid conductive layer electrically isolated from and positioned between the inner and outer conductive layers, the mid conductive layer having a sidewall covered by an insulating material, the insulating material partially overlapping the outer conductive layer sidewall, the electrically conductive sidewall link comprising polysilicon and being positioned over the insulating material.

* * * * *